(12) United States Patent  
Ramaraju et al.

(10) Patent No.: US 7,161,827 B2
(45) Date of Patent: Jan. 9, 2007

(54) SRAM HAVING IMPROVED CELL STABILITY AND METHOD THEREFOR

(75) Inventors: Ravindraraj Ramaraju, Round Rock, TX (US); Prashant U. Kenkare, Austin, TX (US); Jogendra C. Sarker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 26 days.

(21) Appl. No.: 11/033,934

(22) Filed: Jan. 12, 2005

(65) Prior Publication Data

US 2006/0152964 A1  Jul. 13, 2006

(51) Int. Cl.
*G11C 11/00* (2006.01)
(52) U.S. Cl. ........................ 365/154; 365/205
(58) Field of Classification Search ............... 365/154, 365/205
See application file for complete search history.

(56) References Cited

U.S. PATENT DOCUMENTS

| 5,710,742 | A | 1/1998 | Carter |
| 5,828,597 | A | 10/1998 | Madan |
| 6,363,011 | B1 * | 3/2002 | Hirose et al. ........... 365/185.07 |
| 6,510,076 | B1 | 1/2003 | Lapadat et al. |
| 2004/0214389 | A1 * | 10/2004 | Madurawe .................. 438/202 |
| 2004/0238892 | A1 * | 12/2004 | Jung et al. .................. 257/350 |
| 2005/0029556 | A1 * | 2/2005 | Wang et al. ................ 257/250 |

\* cited by examiner

*Primary Examiner*—Michael Tran
(74) *Attorney, Agent, or Firm*—Daniel D. Hill; David G. Dolezal

(57) ABSTRACT

A SRAM (14) includes a SRAM cell (26), the cell (26) includes a first storage node (N1), a second storage node (N2), and a cross coupled latch (40) including a first primary source current path to the first storage node, a first primary sink current path to the first storage node, a second primary source current path to the second storage node, a second primary sink current path to the second storage node, a fifth primary current path to the first storage node, and a sixth primary current path to the second storage node. During standby and/or a read operation of the SRAM cell (26), one of the fifth primary current path and the sixth primary current path is conductive. During a write operation, the fifth primary current path and the sixth primary current path are non-conductive.

19 Claims, 3 Drawing Sheets

SRAM HAVING IMPROVED CELL STABILITY AND METHOD THEREFOR

FIELD OF THE INVENTION

The present invention relates generally to memories, and more particularly, to a static random access (SRAM) memory having improved cell stability and method therefor.

BACKGROUND OF THE INVENTION

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft error, and power supply fluctuations which may cause the cell to inadvertently change logic states. Also, the SRAM cell must provide good stability during read operations without harming speed or the ability to write to the cell.

In a six transistor SRAM cell, an alpha ratio is defined as the width of a PMOS load transistor divided by the width of an NMOS access transistor. A beta ratio is defined as the width of an NMOS pull-down transistor divided by the width of the NMOS access transistor. The alpha and beta ratios are used to describe a SRAM cell's stability against the influences of factors such as power supply fluctuations and noise. Generally, increasing the alpha and beta ratios improves cell stability. However, improving stability comes at the expense of lower write performance.

Therefore, there is a need for a SRAM having improved cell stability without decreased write margins.

DETAILED DESCRIPTION

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Generally, the present invention provides, in one form, a SRAM memory cell having good stability without harming the ability to write. The memory cell includes an additional current path coupled to the storage nodes of the cross-coupled latch that is disabled during a write operation to the cell. The additional current path functions to provide a higher current to maintain the state of the storage nodes during, for example, a read operation. The additional current path is disabled during a write operation, providing for a relatively faster write with less power consumption.

Figure 1:
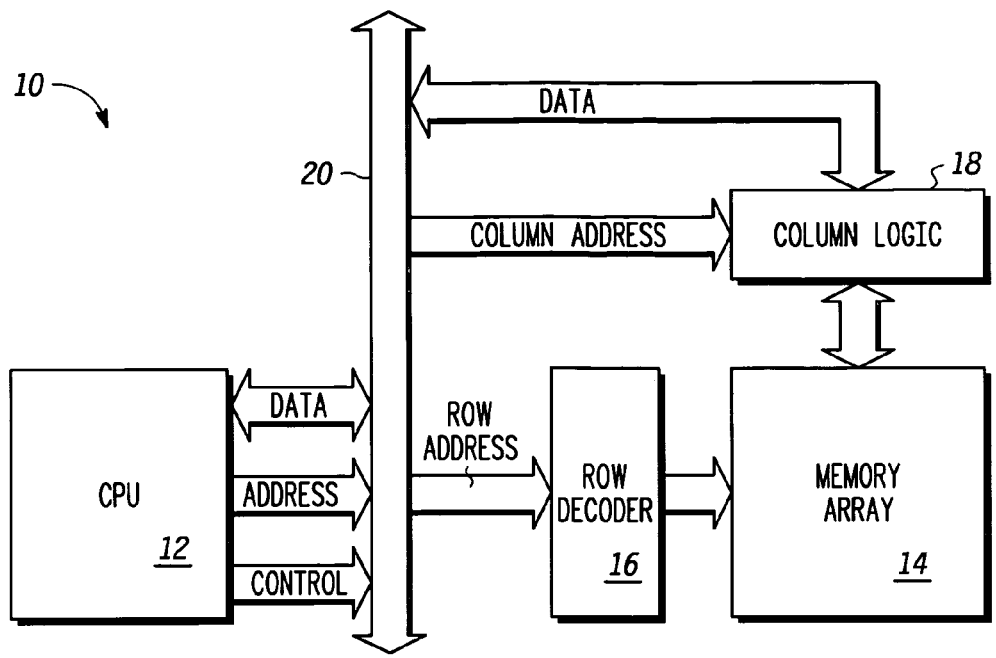
FIG. 1 illustrates, in block diagram, a data processing system in accordance with the present invention.

FIG. 1 illustrates, in block diagram, a data processing system 10 in accordance with the present invention. In one embodiment, data processing system 10 is implemented on an integrated circuit using a silicon-on-insulator (SOI) manufacturing technology. In other embodiments, the data processing system 10 may be implemented in another technology, such as for example, bulk silicon or gallium arsenide. Data processing system 10 includes a central processing system (CPU) 12, a memory array 14, a row decoder 16, a column logic block 18, and a bus 20. CPU 12 may be a processor capable of executing instructions, such as a microprocessor, digital signal processor, etc., or may be any other type of bus master, such as for example, a direct memory access (DMA) controller, debug circuitry, or the like. Also, the processor 12 may be a slave device, such as for example, any type of peripheral circuit which resides on the bus or slave device that requires access to a memory.

CPU 12 is bi-directionally coupled to bus 20. Bus 20 has a plurality of conductors for communicating address, data, and control information between CPU 12 and other circuits coupled to bus 20, such as memory array 14. The row decoder 16 has a plurality of input terminals for receiving a row address from the bus 20 for selecting a row of memory cells in memory array 14. Column logic 18 is bi-directionally coupled to memory array 14 for providing and receiving data in response to column select signal and control information. The column logic receives a column address, and in response, couples one or columns of memory cells to the bus 20. The column logic includes column decoders, sense amplifiers, and precharge and equalization circuits. The sense amplifiers are for sensing and amplifying the relatively low voltage signals from the selected memory cells. In other embodiments, the column logic may include additional or different circuits for inputting and outputting data from the memory.

During a read operation, data signals labeled "DATA" are read from selected memory cells of memory array 14 and provided to bus 20. During a write operation the data signals DATA are provided to selected memory cells from the bus 20. Note that in other embodiments, a bus interface block may be coupled between the bus 20 and the memory.

For purposes of describing the invention, the data processing system 10 of FIG. 1 is simplified to illustrate only a central processing unit and a memory coupled together via a bus. However, in other embodiments, the data processing system may be much more complex, including for example, multiple processors coupled to multiple buses, additional memories, and other circuits not shown in FIG. 1.

Figure 2:
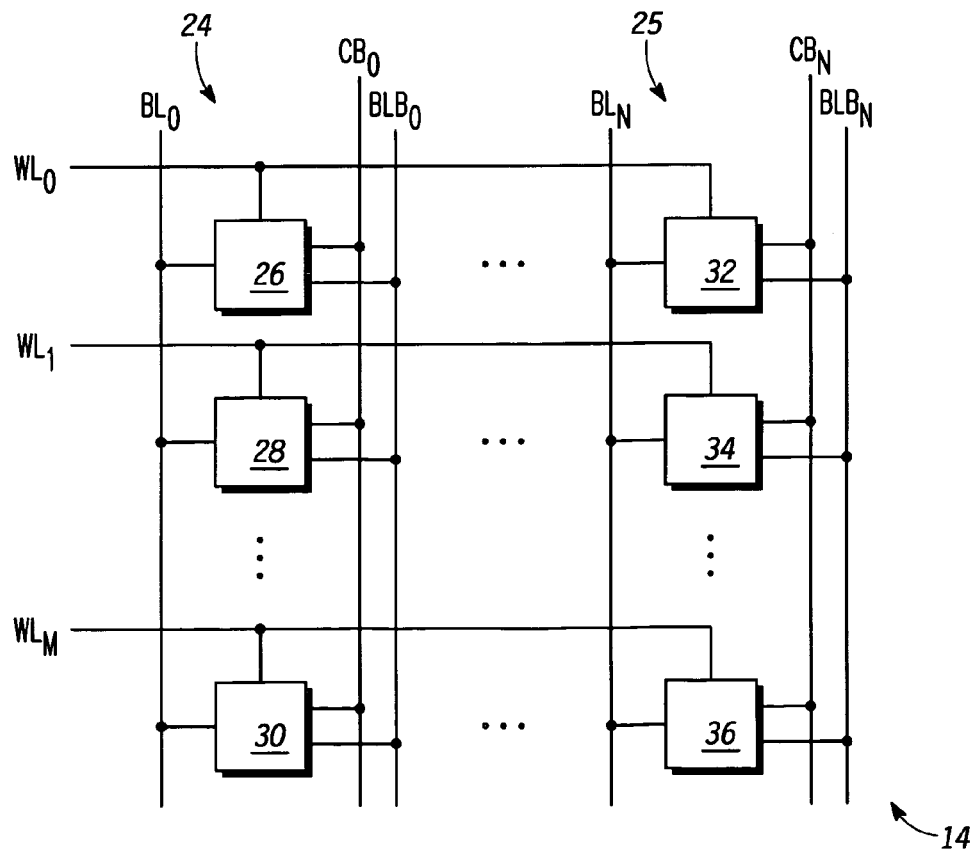
FIG. 2 illustrates the memory array of FIG. 1 in more detail.

FIG. 2 illustrates the memory array 14 of FIG. 1 in more detail. In the memory array 14, the memory cells are organized in row and columns. A column 24 of memory cells includes a bit line pair and all of the memory cells coupled to the bit line pair. For example, the bit line pair labeled "$BL_0$" and "$BLB_0$" and cells 26, 28, 30 comprises one column. A column 25 includes a bit line pair $BL_N$ and $BLB_N$ and memory cells 32, 34, and 36. Note that memory array 14 includes N+1 columns where N is an integer. The bit line pairs are used to communicate differential signals to and from the cells during read and write operations. A row of memory array 14 comprises a word line and all of the memory cells coupled to the word line. For example, a word line labeled "$WL_0$" and memory cells 26 and 32 comprise one row. Likewise, word line $WL_1$ and memory cells 28 and 34 comprise another row. Word line $WL_M$ and memory cells 30 and 36 comprise another row in a memory array having M+1 rows, where M is an integer. Decoded control signals are coupled to each of the memory cells. A control signal labeled "$CB_0$" is coupled to each of the memory cells of column 24, and a control signal labeled "$CB_N$" is coupled to each of the memory cells of column 25. Note that the "B" (bar) at the end of the control signal name indicates that the control signal having the "B" is a logical complement of a control signal having the same name but lacking the "B". The control signal is decoded at the column select level to disable additional current paths in the cells to decrease cell stability during write operations. Note that in other embodiments, the control signals may be coupled to the row decoding logic. The additional current paths for increasing cell stability will be described in more detail below.

Figure 3:
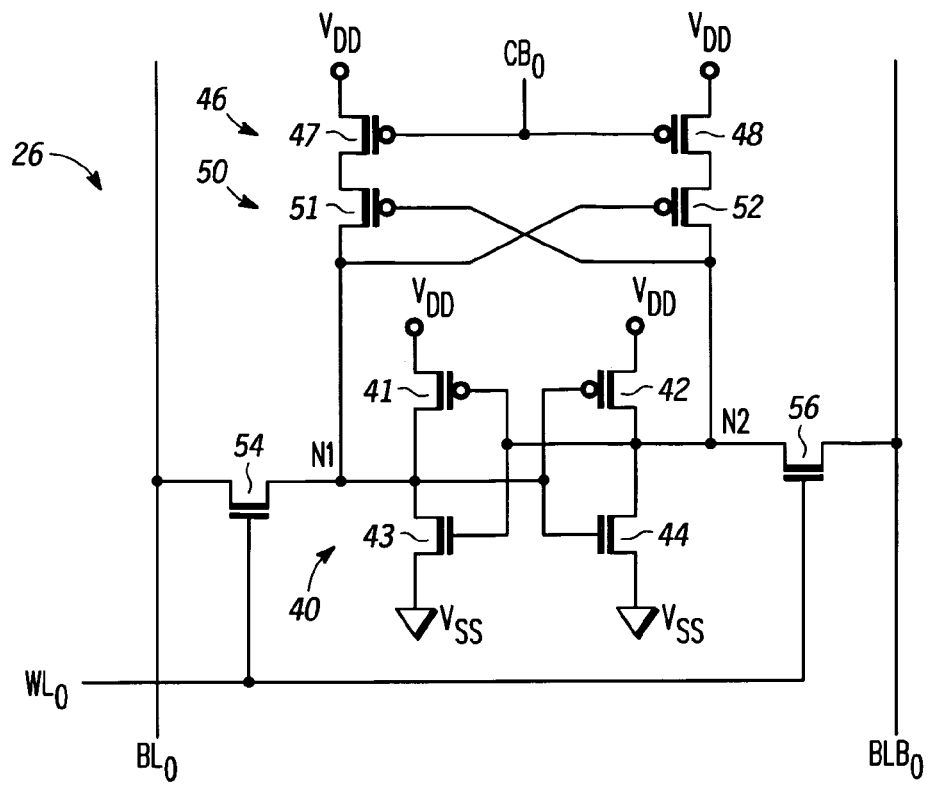
FIG. 3 illustrates, in schematic diagram form, a memory cell of the memory array of FIG. 2 in accordance with a first embodiment of the present invention.

FIG. 3 illustrates, in schematic diagram form, the memory cell 26 of memory array 14 of FIG. 2. Memory cell 26 includes cross-coupled latch 40, enable transistors 46, cross-coupled pair 50, and access transistors 54 and 56. Cross-coupled latch 40 includes P-channel transistors 41 and 42 and N-channel transistors 43 and 44. Enable transistors 46 includes P-channel transistors 47 and 48. Cross-coupled pair 50 includes P-channel transistors 51 and 52.

In cross-coupled latch 40, transistors 41–44 are connected together to form a pair of CMOS inverter circuits. The CMOS inverter circuits have their inputs and outputs connected together at storage nodes N1 and N2. In enable circuit 46, P-channel transistor 47 has a source coupled to a power supply voltage terminal labeled "$V_{DD}$", a gate for receiving a control signal labeled "$CB_0$", and a drain. P-channel transistor 48 has a source coupled to $V_{DD}$, a gate for receiving control signal $CB_0$, and a drain. In cross-coupled pair 50, P-channel transistor 51 has a source coupled to the drain of transistor 47, a gate coupled to node N2, and a drain coupled to node N1. P-channel transistor 52 has a source coupled to the drain of transistor 48, a gate coupled to node N1, and a drain coupled to node N2. Access transistor 54 couples storage node N1 to bit line $BL_0$ in response to a logic high word line select signal on word line $WL_0$. Likewise, access transistor 56 couples storage node N2 to bit line $BLB_0$ in response to a logic high word line select signal on word line $WL_0$. The cross-coupled latch 40 is coupled to the power supply voltage terminal $V_{DD}$ and a power supply voltage terminal labeled "$V_{SS}$". In the illustrated embodiment, $V_{DD}$ is for receiving a positive power supply voltage and $V_{SS}$ is coupled to ground. In other embodiments, other power supply voltages may be used.

During a write operation of memory cell 26, the control signal $CB_0$ is provided at a logic high voltage and word line $WL_0$ is provided with a logic high to couple bit line pair $BL_0$/$BLB_0$ to respective storage nodes. A differential signal representing a bit of information is then provided to bit line pair $BL_0$/$BLB_0$. The cross-coupled latch 40 functions as in a conventional SRAM cell. The logic high control signal $CB_0$ will cause P-channel transistors 47 and 48 to be substantially non-conductive, causing cross-coupled pair 50 to be decoupled from $V_{DD}$. Assuming, for example, that the differential signal provides a logic high to bit line $BL_0$ and a logic low to bit line $BLB_0$, the logic states stored on the storage nodes N1 and N2 will be "flipped" to a logic high and a logic low respectively, if necessary. Because transistors 47 and 48 are non-conductive, the cross-coupled pair of transistors 51 and 52 are not providing a current path to the storage nodes and thus do not harm the ability to write new data into the cross-coupled latch 40.

During a read operation of memory cell 26, the control signal $CB_0$ is provided at a logic low voltage and word line $WL_0$ is provided with a logic high to couple bit line pair $BL_0$/$BLB_0$ to respective storage nodes of the cross-coupled latch 40. A differential signal representing a bit of information is provided to bit line pair $BL_0$/$BLB_0$. P-channel transistors 47 and 48 will be conductive, causing cross-coupled pair 50 to be coupled between $V_{DD}$ and the storage nodes N1 and N2. The cross-coupled pair 50 will provide an additional primary source current path in parallel with the source current path of P-channel transistors 41 and 42 to reinforce the logic states stored on the storage nodes to prevent the logic states of the storage nodes from being changed, or flipped, when the storage nodes are coupled to the bit lines.

Note that as the power supply voltage decreases, the cell stability decreases. Using the cross-coupled pair 50 as an additional current path during read operations maintains read margins and cell stability during operation at lower power supply voltages. Also, in another embodiment, the cross-coupled pair 50 may be enabled when the memory 14 is not being accessed, that is, during a storage mode of operation, especially during low voltage operations such as during a sleep mode, to increase cell stability during, for example, the occurrence of transients, process variations, soft error, and power supply fluctuations. In addition, in yet another embodiment, the cross-coupled pair 50 may be enabled during the storage mode of operation and during read operations, and disabled during write operations.

Because the SRAM cell 26 includes four additional transistors, the greatest benefit is derived in relatively small, high speed, memory arrays where the impact of the increased layout area is minimized. However, the SRAM cell 26 may provide advantages, such as increased stability without harm to the write margins, in any sized array.

Figure 4:
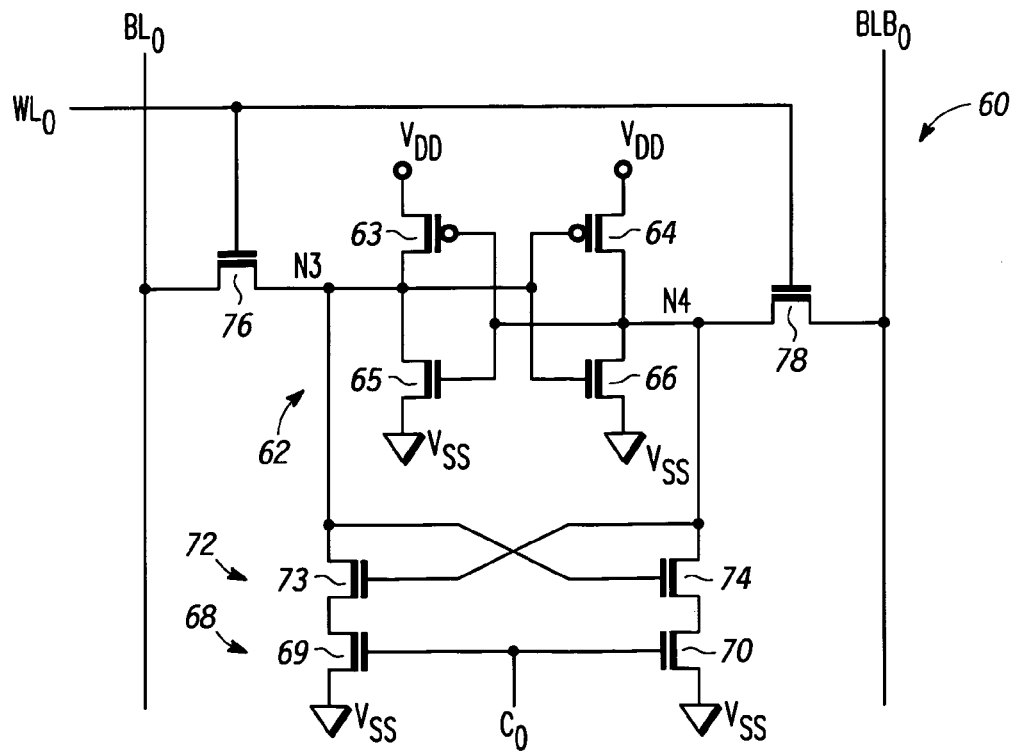
FIG. 4 illustrates, in schematic diagram form, a memory cell of the memory array of FIG. 2 in accordance with a second embodiment of the present invention.

FIG. 4 illustrates, in schematic diagram form, a memory cell 60 in accordance with another embodiment of the present invention. Memory cell 60 includes a cross-coupled latch 62, a cross-coupled pair 72, a pair of enable transistors 68 and access transistors 76 and 78. Cross-coupled latch 62 includes P-channel transistors 63 and 64 and N-channel transistors 65 and 66. Storage nodes N3 and N4 of cross-coupled latch 62 are coupled to the bit line pair $BL_0$/$BLB_0$ via access transistors 76 and 78. Enable transistors 68 includes N-channel transistors 69 and 70. Cross-coupled pair 72 includes N-channel transistors 73 and 74. Memory cell 60 is implemented to be a mirror image of memory cell 26 in FIG. 3 and provides an additional current path for maintaining cell stability. Note that control signal $C_0$ of FIG. 4 is active as a logic high voltage instead of a logic low voltage as described above regarding control signal $CB_0$.

Figure 5:
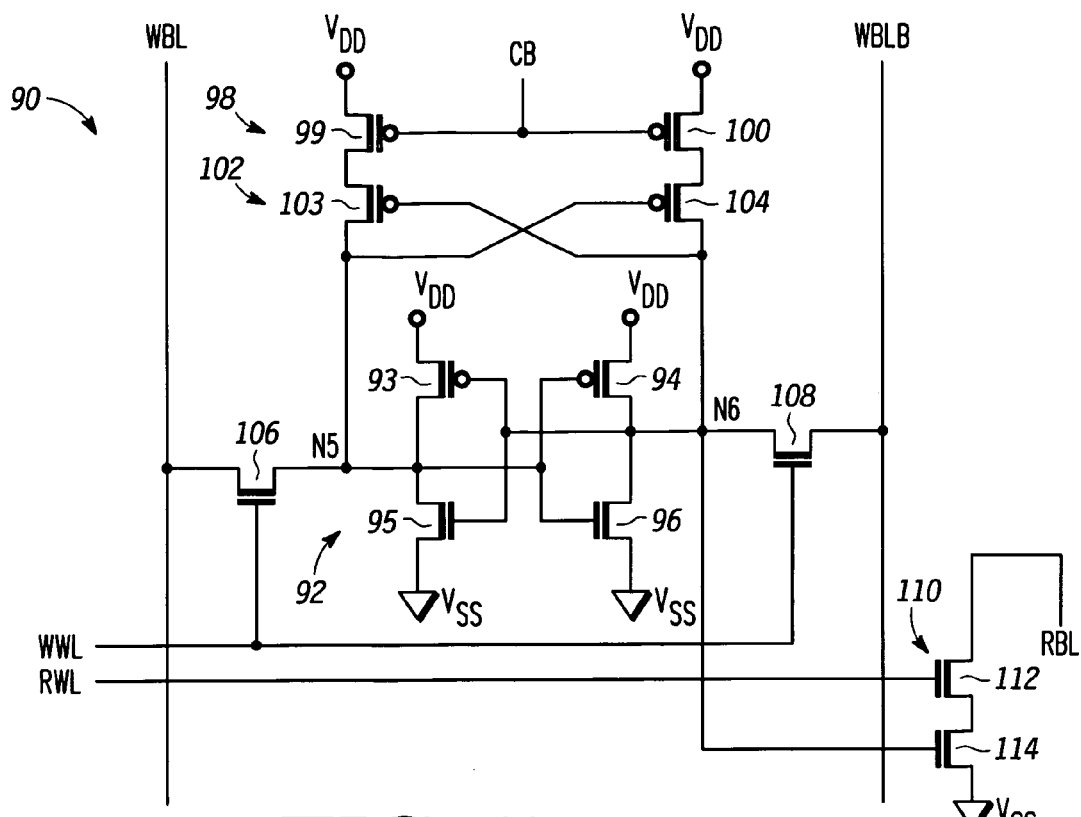
FIG. 5 illustrates, in schematic diagram form, a memory cell in accordance with a third embodiment of the present invention.

FIG. 5 illustrates, in schematic diagram form, a memory cell 90 in accordance with another embodiment of the present invention. Memory cell 90 is a dual-port memory and includes a cross-coupled latch 92, an enable circuit 98, a cross-coupled pair 102, access transistors 106 and 108, and a read port 110. Cross-coupled latch 92 includes P-channel transistors 93 and 94 and N-channel transistors 95 and 96. Storage nodes N5 and N6 of cross-coupled latch 92 are coupled to write bit line pair WBL/WBLB via access transistors 106 and 108. Enable circuit 98 includes P-channel transistors 99 and 100. Cross-coupled pair 102 includes P-channel transistors 103 and 104. Read port 110 includes N-channel transistors 112 and 114. In dual-port memory 90, write bit line pair WBL/WBLB is for providing data to storage nodes N5 and N6 during a write cycle in a manner identical to the write operation of memory cell 26 of FIG. 3.

During a read operation, read port 110 relies on single-ended sensing and is used to read the logic state of storage node N6. During the read operation, transistor 112 is made conductive and if storage node N6 is a logic high, transistor 114 becomes conductive and causes read bit line RBL to output a logic low voltage. Also, during the read operation, the control signal CB is a logic low causing cross-coupled pair 102 and enable circuit 98 to function as described for cross-coupled pair 50 and enable circuit 46 in FIG. 3. Note that in other embodiments, read port 110 may use differential sensing.

Figure 6:
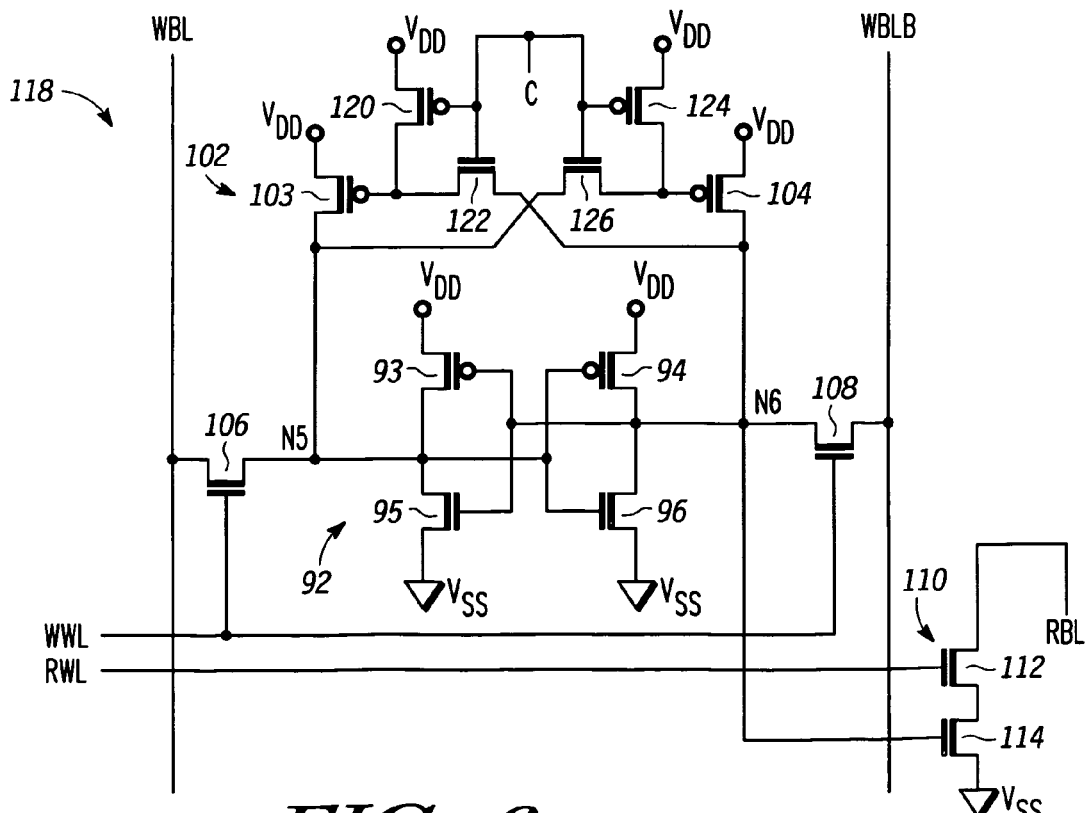
FIG. 6 illustrates, in schematic diagram form, a memory in accordance with a fourth embodiment of the present invention.

FIG. 6 illustrates, in schematic diagram form, a memory cell 118 in accordance with a fourth embodiment of the present invention. In FIG. 5 and FIG. 6, similar elements use the same reference numbers. Memory cell 118 is similar to memory cell 90, except that the enable transistors 122 and 126 are implemented between the gates of cross-coupled transistors 103 and 104 and storage nodes N5 and N6. The gates of cross-coupled transistors 103 and 104 are disconnected during a write operation by asserting CB as a logic low to cause N-channel transistors 122 and 126 to be substantially non-conductive. The P-channel transistors 120 and 124 prevent the gates of transistors 103 and 104 from floating during a write operation by coupling them to VDD. Otherwise, the operation of memory cell is the same as described above for memory cell 26 of FIG. 3 and memory cell 90 of FIG. 5. Note that the embodiments of FIG. 5 and FIG. 6 may be implemented using N-channel transistors for the cross-coupled pairs 102 as described above for the embodiment of FIG. 4.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method of operating a SRAM memory including an SRAM memory cell, the memory cell includes a first storage node, a second storage node, and a cross coupled latch including a first primary source current path to the first storage node, a first primary sink current path to the first storage node, a second primary source current path to the second storage node, a second primary sink current path to the second storage node, a fifth primary current path to the first storage node, and a sixth primary current path to the second storage node, the method comprising:
    reading the memory cell; and
    writing to the memory cell, wherein during the writing to the memory cell, the fifth primary current path includes a first transistor and the sixth primary current path includes a second transistor, wherein one of the first transistor and the second transistor is conductive during a read of the memory cell and the first transistor and the second transistor are non-conductive during a write to the memory cell.

2. The method of claim 1 wherein the fifth primary current path is in parallel with the first primary source current path and the sixth primary current path is in parallel with the second primary source current path.

3. The method of claim 1 wherein the fifth primary current path is in parallel with the first primary sink current path and the sixth primary current path is in parallel with the second primary sink current path.

4. The method of claim 1 wherein the first transistor includes a control terminal coupled to the second storage node and the second transistor includes a control terminal coupled to the first storage node.

5. The method of claim 1 wherein:
    the first source current path includes a first transistor, the first transistor includes a control terminal coupled to the second storage node;
    the first sink current path includes a second transistor, the second transistor includes a control terminal coupled to the second storage node;
    the second source current path includes a third transistor, the third transistor includes a control terminal coupled to the first storage node;
    the second sink current path includes a fourth transistor, the fourth transistor includes a control terminal coupled to the first storage node;
    the fifth primary current path includes a fifth transistor, the fifth transistor includes a control terminal coupled to the second storage node;
    the sixth primary current path includes a sixth transistor, the sixth transistor includes a control terminal coupled to the first storage node.

6. The method of claim 1 wherein:
    the fifth primary current path includes a first transistor;
    the sixth primary current path includes a second transistor;
    wherein the first transistor and the second transistor are conductive during the reading the memory cell;
    wherein the first transistor and the second transistor are non conductive during the writing to the memory cell.

7. An SRAM memory cell comprising:
    a first storage node;
    a second storage node;
    a cross coupled latch including a first terminal coupled to the first storage node and a second terminal coupled to the second storage node, the cross coupled latch including:
        a first primary source current path to the first storage node;
        a first primary sink current path to the first storage node;
        a second primary source current path to the second storage node; and
        a second primary sink current path to the second storage node;
    a fifth primary current path to the first storage node; and
    a sixth primary current path to the second storage node;
    wherein one of the fifth primary current path and the sixth primary current path is non-conductive during a write to the memory cell.

8. The apparatus of claim 7 wherein the fifth primary current path is in parallel with the first primary source current path and the sixth primary current path is in parallel with the second primary source current path.

9. The memory cell of claim 7 wherein the fifth primary current path is in parallel with the first primary sink current path and the sixth primary current path is in parallel with the second primary sink current path.

10. The memory cell of claim 7 wherein the fifth primary current path includes a first transistor and the sixth primary current path includes a second transistor, wherein one of the first transistor and the second transistor is conductive during a read of the memory cell and the first transistor and the second transistor are non conductive during a write to the memory cell.

11. The memory cell of claim 10 wherein the first transistor includes a control terminal coupled to the second storage node and the second transistor includes a control terminal coupled to the first storage node.

12. The memory cell of claim 10 further comprising:
a third transistor coupled between the control terminal of the first transistor and the second storage node;
a fourth transistor coupled between the control terminal of the second transistor and the first storage node;
the third transistor and the fourth transistor are conductive during a read of the memory cell; and
the third transistor and the fourth transistor are non conductive during a write to the memory cell.

13. The memory cell of claim 7 wherein:
the first source current path includes a first transistor, the first transistor includes a control terminal coupled to the second storage node;
the first sink current path includes a second transistor, the second transistor includes a control terminal coupled to the second storage node;
the second source current path includes a third transistor, the third transistor includes a control terminal coupled to the first storage node; and
the second sink current path includes a fourth transistor, the fourth transistor includes a control terminal coupled to the first storage node.

14. The memory cell of claim 7 wherein:
the fifth primary current path includes a first transistor;
the sixth primary current path includes a second transistor; and
the first transistor and the second transistor are conductive during a read of the memory cell;
wherein the first transistor and the second transistor are non conductive during a write to the memory cell.

15. The memory cell of claim 7 further comprising:
a first bit line;
a second bit line complementary to the first bit line;
a first transistor coupled between the first bit line and the first storage node; and
a second transistor coupled between second bit line and the second storage node.

16. The memory cell of claim 7 further comprising:
a read bit line, the read bit line including a transistor;
wherein the first storage node is coupled to a control terminal of the transistor.

17. The memory cell of claim 7 wherein the memory cell is implemented on a silicon-on-insulator (SOI) integrated circuit.

18. A data processing system comprising a processor and a memory array operably coupled to the processor, the memory array including the memory cell of claim 7.

19. A SRAM memory cell comprising:
a first storage node;
a second storage node;
a cross coupled latch including a first terminal coupled to the first storage node and a second terminal coupled to the second storage node, the cross coupled latch including:
a first primary source current path to the first storage node;
a first primary sink current path to the first storage node, the first primary sink current path including a first transistor, the first transistor including a control terminal coupled to the second storage node;
a second primary source current path to the second storage node; and
a second primary sink current path to the second storage node, the second primary sink current path including a second transistor, the second transistor including a control terminal coupled to the first storage node;
a fifth primary current path to the first storage node, the fifth primary current path includes a third transistor, the third transistor having a control terminal coupled to the second storage node, wherein the fifth primary current path is in parallel with the first primary source current path or the first primary sink current path; and
a sixth primary current path to the second storage node, the sixth primary current path includes a fourth transistor, the fourth transistor having a control terminal coupled to the first storage node, wherein the sixth primary current path is in parallel with the second primary source current path or the second primary sink current path;
wherein one of the fifth primary current path and the sixth primary current path is conductive during a read of the memory cell, and the fifth primary current path and the sixth primary current path are non conductive during a write to the memory cell.

* * * * *